INTEGRATED CIRCUIT WITH COMPONENT DEFINING GROOVE

INVENTOR.
MELVIN W. AARONS
BY
Shenier & O'Connor
ATTORNEYS

INTEGRATED CIRCUIT WITH COMPONENT DEFINING GROOVE

Filed Feb. 27, 1963 3 Sheets-Sheet 2

INVENTOR.
MELVIN W. AARONS
BY
Shenier & O'Connor
ATTORNEYS

May 31, 1966 M. W. AARONS 3,254,277

INTEGRATED CIRCUIT WITH COMPONENT DEFINING GROOVE

Filed Feb. 27, 1963 3 Sheets-Sheet 3

INVENTOR.
MELVIN W. AARONS
BY
Shenier & O'Connor
ATTORNEYS

United States Patent Office 3,254,277

Patented May 31, 1966

3,254,277

INTEGRATED CIRCUIT WITH COMPONENT DEFINING GROOVE

Melvin W. Aarons, Trumbull, Conn., assignor to United Aircraft Corporation, East Hartford, Conn., a corporation of Delaware Filed Feb. 27, 1963, Ser. No. 261,424
1 Claim. (Cl. 317—235)

My invention relates to an integrated circuit and more particularly to an improved integrated circuit which is simpler and more easily constructed than are assembled microelectronic circuits of the prior art and to a method of making the same.

There are known in the prior art methods of forming microelectronic circuit components. By use of the various techniques, circuit components such as resistors, capacitors, inductors, diodes and transistors can be formed. In certain instances it is possible to form more than a single component on one slice or block of material. For most complete circuits it is required that various components or elements of the circuit be electrically isolated over most of their extent and then be interconnected in the required manner to produce the desired circuit. In techniques employed in the prior art such, for example, as the diffusion technique, individual components of the type described above can be formed on individual blocks or crystals. A number of components may concomitantly be formed on a single crystal. However, in order to produce the desired electrical circuit, individual components must be sawed off or otherwise physically separated from the crystal and then be assembled and connected to provide the required circuit by techniques which are awkward, cumbersome and expensive considering the extremely small size of the components.

I have invented an improved integrated circuit which overcomes the difficulty of assembled microelectronic circuits of the prior art pointed out hereinabove. My integrated circuit permits a relatively complicated electrical structure to be formed on a single crystal or block. My improved integrated circuit permits the formation of a relatively complex monolithic integrated circuit in a simple and expeditious manner. My improved integrated circuit is less expensive to produce than is an assembled microelectronic circuit of the type known in the prior art which is assembled by connecting individual physically separated solid components. I have provided a method for making a monolithic microelectronic circuit which is simpler and less expensive than are techniques of the prior art. My method permits the formation on a single block of a circuit comprising a relatively large number of electrically isolated components.

One object of my invention is to provide an improved integrated circuit which overcomes the disadvantages of assembled microelectronic circuits of the prior art.

Another object of my invention is to provide an improved integrated circuit which is more easily formed and which is less expensive than are assembled microelectronic circuits of the prior art.

Another object of my invention is to provide a method of forming an integrated microelectronic circuit which is less expensive than are methods of the prior art for forming microelectronic circuits.

Yet another object of my invention is to provide a method of making an integrated microelectronic circuit which is simpler and more expeditious than are methods of the prior art for producing microelectronic circuits.

Other and further objects of my invention will appear from the following description.

In general my invention contemplates the provision of an integrated or monolithic circuit comprising various components which are selectively isolated by troughs extending through an epitaxially grown layer of one conductivity type into a substrate of another conductivity type to form back-to-back diodes which isolate the components.

In the accompanying drawings which form part of the instant specification and which are to be read in conjunction therewith and in which like reference numerals are used to indicate like parts in the various views:

FIGURE 9 is a schematic view illustrating the equivalent circuit of the form of my improved integrated circuit illustrated in FIGURES 1 to 8.

Figures 1, 2, 3, 4:
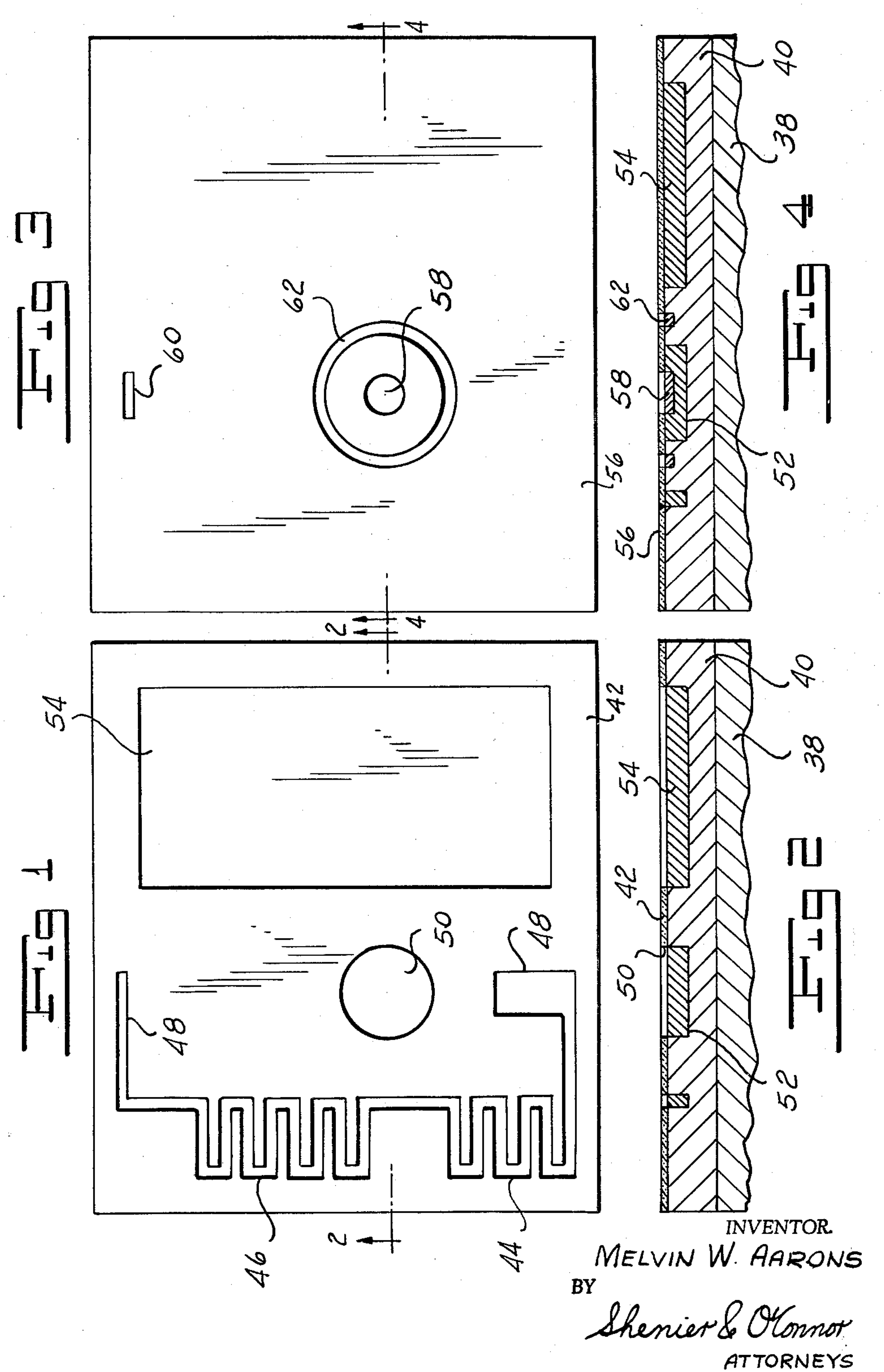
FIGURE 1 is a plan view of one form of my improved integrated circuit during an initial step in the course of its formation.
FIGURE 2 is a sectional view of the form of my improved integrated circuit shown in FIGURE 1 taken along the line 2—2 of FIGURE 1.
FIGURE 3 is a plan view of one form of my improved integrated circuit illustrating an intermediate step in the course of its formation.
FIGURE 4 is a sectional view of the form of my improved integrated circuit shown in FIGURE 3 taken along the line 4—4 of FIGURE 3.
Figures 4, 5, 6:
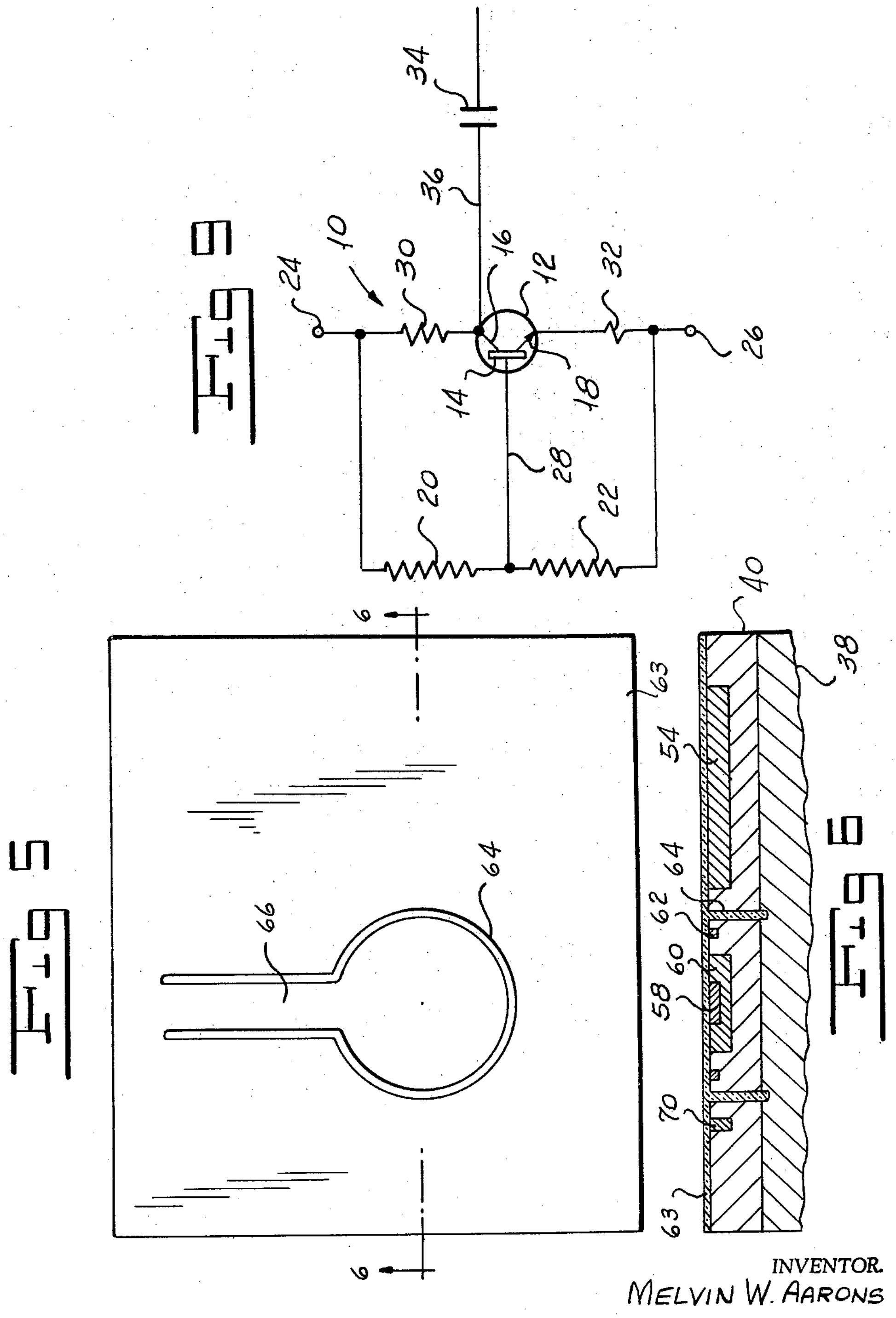
FIGURE 5 is a plan view illustrating one form of my improved integrated circuit during a further intermediate step in the formation thereof.
FIGURE 6 is a sectional view of the form of my improved integrated circuit shown in FIGURE 5 taken along the line 6—6 of FIGURE 5.

Referring now to FIGURE 9, I have illustrated the equivalent circuit of one form of my improved integrated circuit. For purposes of illustration only, I have shown in the drawings an amplifier which may be used for example as an encoder bit amplifier circuit. The amplifier indicated generally by the reference character 10 includes a transistor 12 having a base 14, a collector 16 and an emitter 18. Respective voltage dividing resistors 20 and 22 connected across terminals 24 and 26 are adapted to provide a biasing potential which is applied to the base 14 by a conductor 28. I connect a collector resistor 30 between terminal 24 and collector 16. An emitter biasing resistor 32 is connected between emitter 18 and terminal 26. I connect a coupling capacitor 34 in the output conductor 36 of the amplifier 10.

Referring now to FIGURES 1 and 2, the form of my integrated circuit shown in the drawings includes a single crystal substrate 38 of any suitable material. I deposit an epitaxial film 40 on the substrate 38 by any suitable technique known in the prior art, such as by vapor deposition. The material 38 and the film 40 may be, for example, a silicon substrate carrying a silicon film or a germanium substrate carrying a germanium film. The film 40 is approximately 12 microns thick.

As has been pointed out hereinabove, the epitaxial film 40 may be produced on the substrate 38 by any suitable means. Vacuum evaporation and vapor deposition are two possible techniques. In one method, a carrier gas such as hydrogen, for example, is allowed to bubble through a halide of the same material as the substrate and the mixture is passed over the heated substrate where the semiconductor is deposited. The remaining product of the reaction is removed by means of a vent. Halides of the doping element required to produce a semiconductor device can be added to the gas stream so that the doping element is reduced along with the semiconductor. Boron, phosphorus and arsenic halides have been used for this purpose. These methods of producing epitaxial films such as the film 40 on the substrate 38 are more fully described in "Epitaxial Techniques in Semiconductor Devices" by Sigler and Watelski, published on pages 33 to 37 of the March 1961 issue of "The Solid State Journal."

In the particular example of my integrated circuit illustrated in the drawings I have chosen a high-resistivity p-type conductivity substrate 38 carrying an n-type epitaxial layer having a resistivity of about 0.5 ohm-cm. The substrate 38 may be silicon carrying a silicon epitaxial film 40.

After the film 40 has been formed on the substrate 38, I oxidize the assembly in steam at about 1000° C. for four to five hours to form a relatively thick layer 42 of silicon dioxide. When the layer 42 has been formed I produce a photoresist pattern in the oxide corresponding to the configuration of certain components of the completed integrated circuit. The photoresist technique which I employ selectively to remove the oxide 42 is similar to that which is employed in making etched circuit boards. First the photographic resist is applied in liquid form as by dipping. When dry, the resist forms a thin plastic film which is photographically sensitive to ultraviolet light. This film then is exposed by contact printing so that the exposed portions become insoluble in the developer. Resists under the opaque areas of the negative are removed by the developer while the resists under the clear areas of the negative remain. Next the assembly is subjected to the action of a suitable material such, for example, as hydrofluoric acid which removes the oxide where it is unprotected by the resist. Since the photoresist technique is per se known in the art, it has not been illustrated in detail.

When the desired pattern has been photoetched through the oxide film 42 in the manner described above, I then diffuse a suitable dopant for a predetermined depth into the film 40 over the exposed areas to form a plurality of p-type doped areas in the film 40. In one method of diffusing these areas into the layer or film 40 the assembly is heated to approximately 1200° in the presence of an impurity gas such, for example, as boron. Other type diffusants may be aluminum, gallium, indium or thallium. This operation can be achieved by vacuum-sealing the diffusant together with the wafers in a tube or by controlling the temperature and consequently the vapor pressure of the diffusant independently of the silicon temperature or by applying a diffusant directly to the assembly or wafer before heating.

In this step of forming the particular integrated circuit which I have illustrated in the drawing, I diffuse an irregular area 44 which, as will be described hereinafter, forms the resistor 22, an irregular area 46 forming the resistor 20 and an area 48 which forms resistor 32. A circular area 50 forms the base area of the transistor and forms the base to collector junction 52 with the film 40. A rectangular area 54 forms one plate of the capacitor 34.

Referring now to FIGURES 3 and 4, when the steps illustrated in FIGURES 1 and 2 have been achieved, I reoxidize the wafer with steam as described hereinabove and photoetch a new pattern through the new oxide layer 56 by the photoresist technique described hereinabove. Into the areas exposed by the etched new oxide film 56 I diffuse an impurity suitable for forming material of an n-type conductivity. A circular area 58 having a diameter which is less than that of the area 50 is diffused into the already diffused area 52 to form the emitter 18 of the transistor 12. An area 60 is provided for making good ohmic contact by aluminum to be described hereinafter with a region of the film 40 to be defined hereinafter. A ringlike area 62 is diffused to make good ohmic contact with the collector of the transistor.

Referring now to FIGURES 3 to 6, having developed the intermediate form of my integrated circuit illustrated in FIGURES 3 and 4, I reoxidize the wafer to form another oxide film 63. I then etch a pattern in the film 63 of the shape illustrated in FIGURE 5 into the newly formed film 63. Having thus formed the photoresist pattern, I etch a trough 64 to the shape of the pattern shown in FIGURE 5. I etch trough 64 to such a depth that it extends through the epitaxial film 40 and into the substrate 38. Owing to its shape, trough 64 surrounds the diffused areas 62, 58 and 52 to define the collector of the transistor. Moreover, it defines an area 66 of the film 40 which extends from the collector to the diffused area 60. This area 66 corresponds to the resistor 30 of the equivalent circuit shown in FIGURE 9. It will now be apparent that the diffused area 60 provides a means for making good ohmic contact with the end of the area 66 corresponding to resistor 30.

The significant feature of the trough 64 is that it extends through the epitaxial layer 40 and into the substrate. In this manner it defines two back-to-back junctions going from the film 40 to the substrate 38 on one side of the trough and going from the substrate 38 to the film 40 on the other side of the trough 64. Thus these two junctions serve to isolate the transistor 12 and the resistor 30 from the portion of the wafer making up the remaining elements of the monolithic circuit. If a positive potential is applied, for example, to the layer 40 on one side of the trough 64, it first encounters a reverse-biased junction plane which prevents the flow of current to the other side of the trough via the substrate. Conversely, if a positive potential is applied to the layer 40 on the other side of the trough 64, it again will encounter a reverse-biased junction plane so that no current flow will result. Thus layer 40 on one side of the trough is electrically isolated from the layer 40 on the other side of the trough.

Figures 7, 8:
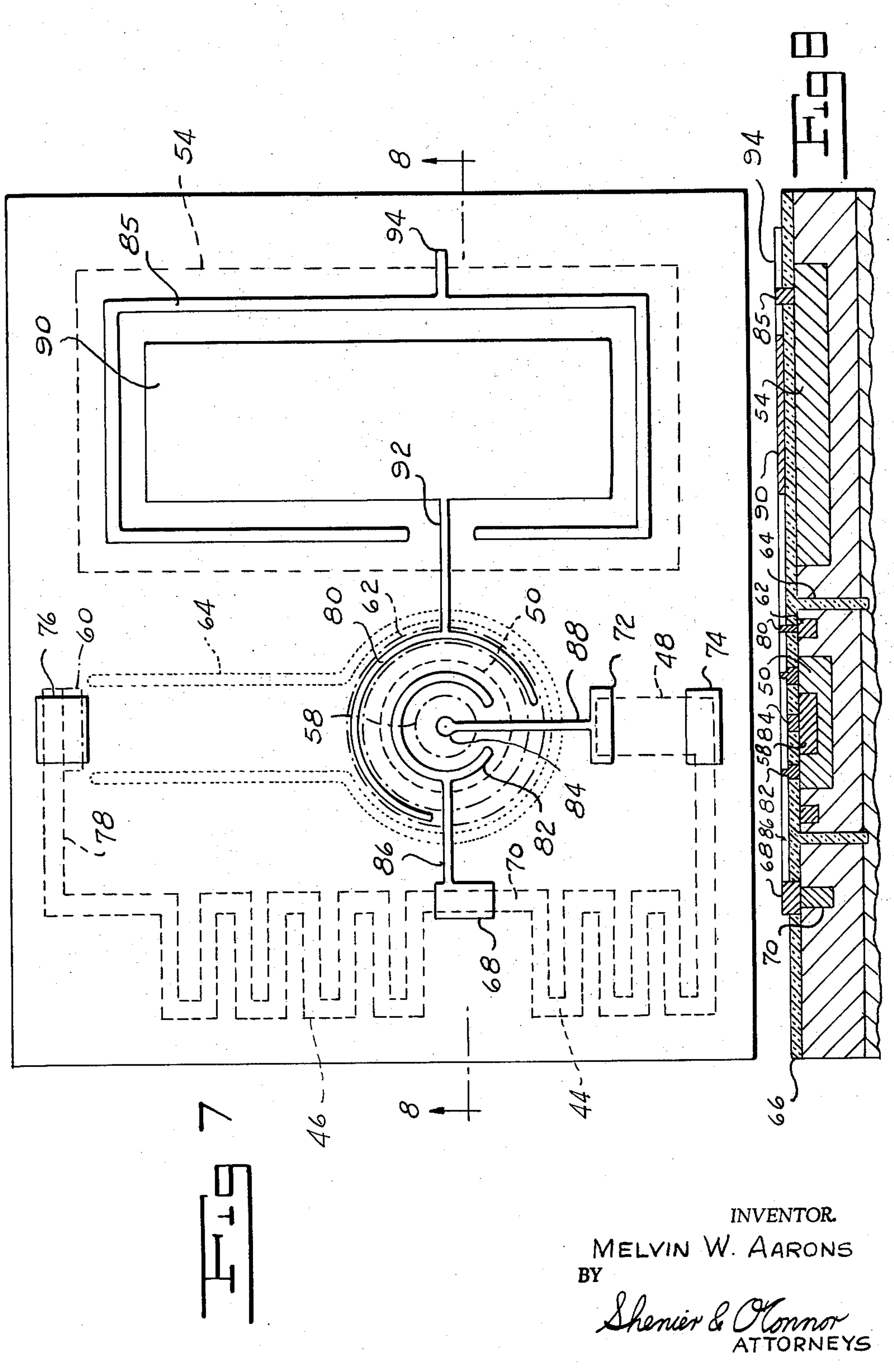
FIGURE 7 is a plan view illustrating the final step in the formation of one form of my improved integrated circuit.
FIGURE 8 is a sectional view of the form of my improved integrated circuit shown in FIGURE 7 taken along the line 8—8 of FIGURE 7 and drawn on an enlarged scale.

After the isolating trough 64 has been formed in the manner described above, the entire wafer is then reoxidized to form the final oxide film 66. It remains only to make the required electrical connections. Referring to FIGURES 7 and 8 the final oxide film 66 is etched by the photoresist techniques to expose the doped areas to which contact is to be made. After this has been done, conductive material such, for example, as aluminum, is deposited in selected areas to make the connections and to form the upper capacitor plate. This is achieved by depositing metal through a suitable mask by techniques known in the art.

Referring now to FIGURES 7 and 8, in the particular form of my integrated circuit illustrated in the drawings, I deposit metal onto an area 68 through the oxide to contact a portion 70 of the doped area connecting areas 44 and 46. Respective areas of conductive materials 72 and 74 contact the ends of the diffused area 48. A conductive area 76 extends through the oxide film into contact with an area 78 connected to the area 46 and into contact with the area 60 to form the terminal 24. Respective arcuate areas 80 and 82 extend through the oxide film 66 into engagement with the doped area 62 for making ohmic contact with the collector area defined by trough 64 and into contact with the doped area 50 to make electrical contact with the base. An area 84 of conductive material extends through the oxide film 66 into contact with the emitter area 58. An area 85 of conductive material running around the lower capacitor plate area 54 adjacent the periphery thereof extends through the film 66 into contact with the area 54.

Areas other than those described above of conductive material extend over the oxide film 66. A line 86 of conductive material makes contact between the area 68 and the area 82. A line 88 makes electrical contact between the area 72 and area 84. A relatively large area 90 of conductive material over the dielectric film makes up the other plate of capacitor 34. A line 92 of conductive material connects this area with the area 80 and a line 94 connected to the line 85 provides a connection to succeeding components.

While I have described specifically an amplifier circuit as my improved integrated circuit it is to be understood that my improved circuit may comprise any particular circuit made up of a number of circuit elements, at least two of which require electrical isolation of the portions of the block to define the elements.

In the general use of my method of making an improved integrated circuit I first form the epitaxial film 40 on the substrate 38 in the manner described above. For example, the film 40 may be a silicon film of a thickness of about 12 microns on a silicon substrate 38. When I have done this I form a relatively thick oxide film such as the film 42 on top of the layer 40. It is to be understood that the relative thicknesses illustrated in the drawing are for purposes of demonstration only. By use of the photoresist technique, I then etch areas to be doped through the film 42 and dope the area in the manner described hereinabove, for example, in connection with areas 44, 46 and 54 shown in FIGURE 1.

When the first doping operation is complete, I then reoxidize the wafer, etch the new pattern and perform the second doping operation such, for example, as has been described hereinabove in connection with the areas 58, 60 and 62 shown in FIGURES 3 and 4. In the steps thus far performed I have so doped the wafer as to provide areas which, if electrically isolated, would form the required components. Knowing these areas I form a new photoresist pattern representing the areas required to be isolated and then etch a trough such as the trough 64 shown in FIGURES 5 and 6 to a depth such that it extends through the epitaxial layer 40 and into the substrate 38. As has been described hereinabove this trough forms respective diodes at the junction between the substrate 38 and the film 40 which are connected in back-to-back relationship across the trough so as to isolate areas of the wafer as required to form the desired components. After this has been done the wafer is reoxidized to form an oxide film over the trough 64. Then a suitable pattern required to produce the necessary connections is etched in the new oxide film such as in film 66 and conductive material such as aluminum or the like is vapor-deposited through a mask to form the required connections as well as elements such as the capacitor plate 90 shown in FIGURES 7 and 8.

It will be seen that I have accomplished the objects of my invention. I have provided an improved integrated circuit which overcomes the defects of microelectronic circuits of the prior art which require separation and subsequent assembly. My improved integrated circuit permits a circuit comprising a large number of varied elements to be formed on a single monolithic block. I have invented a method by which integrated circuits can be formed in a rapid and expeditious manner. My method permits integrated circuits to be formed at less expense than is involved in the formation of integrated circuits by methods of the prior art.

It will be understood that certain features and subcombinations are of utility and may be employed without reference to other features and subcombinations. This is contemplated by and is within the scope of my claim. It is further obvious that various changes may be made in details within the scope of my claim without departing from the spirit of my invention. It is, therefore, to be understood that my invention is not to be limited to the specific details shown and described.

Having thus described my invention, what I claim is:

An integrated transistor circuit including in combination a planar semiconductor substrate of one conductivity type having a semiconductive surface layer of the opposite conductivity type and of a certain thickness, a groove of sufficient depth to extend through the layer and into the substrate, the groove substantially enclosing first and second contiguous regions of the layer, the first of said regions having a large ratio of area to perimeter and the second region having a length appreciably greater than its width so that its ratio of area to perimeter is smaller than that of the first region, a transistor base region of said one conductivity type formed within said first region and having a depth less than the thickness of the layer, a third region of said opposite conductivity type formed within said base region and having a depth less than that of the base region, one of the first and third regions comprising the collector and the other comprising the emitter of a transistor including said base region, a fourth region of said one conductivity type formed in the layer externally of and extending at one point into close proximity with the groove, the fourth region having a length appreciably greater than its width so that its ratio of area to perimeter is smaller than that of the first region and having a depth less than the thickness of the layer, and means providing an electrical connection between said point of the fourth region and one of the other regions, the second and fourth regions comprising resistors of unlike conductivity type.

References Cited by the Examiner

UNITED STATES PATENTS

| | | | |
|---|---|---|---|
| 2,666,814 | 1/1954 | Shockley | 317—235 X |
| 2,981,645 | 3/1961 | Tucker | 148—1.5 |
| 2,981,877 | 4/1961 | Noyce | 317—235 |
| 2,989,426 | 6/1961 | Rutz | 148—1.5 |
| 3,100,276 | 8/1963 | Meyer | 317—234 |
| 3,110,870 | 11/1963 | Ziffer | 317—234 X |
| 3,112,411 | 11/1963 | Cook et al. | 317—235 X |
| 3,115,581 | 12/1963 | Kilby | 317—235 X |
| 3,134,912 | 5/1964 | Evans | 317—234 X |
| 3,136,897 | 6/1964 | Kaufman | 317—235 |
| 3,138,744 | 6/1964 | Kilby | 317—235 |
| 3,142,021 | 7/1964 | Stelmak | 317—235 X |

JOHN W. HUCKERT, *Primary Examiner.*

JAMES D. KALLAM, DAVID J. GALVIN, *Examiners.*

C. E. PUGH, A. M. LESNIAK, *Assistant Examiners.*